United States Patent [19]

Thome

[11] Patent Number: 4,944,447

[45] Date of Patent: Jul. 31, 1990

[54] BONDING VERIFICATION PROCESS INCORPORATING TEST PATTERNS

[75] Inventor: John R. Thome, Fort Worth, Tex.

[73] Assignee: Motorola, Inc., Schaumburg, Ill.

[21] Appl. No.: 330,039

[22] Filed: Mar. 29, 1989

[51] Int. Cl.5 .............................................. B23K 1/19
[52] U.S. Cl. ..................... 228/103; 228/105; 228/8; 228/179; 228/104
[58] Field of Search ................ 228/103, 104, 105, 8, 228/179, 180.2; 156/378

[56] References Cited

U.S. PATENT DOCUMENTS

| 4,224,744 | 9/1980 | Siegel et al. | 228/103 |
| 4,467,638 | 8/1984 | Greenstein | 228/103 |
| 4,667,869 | 5/1987 | Gen et al. | 228/103 |
| 4,696,104 | 9/1987 | Vanzetti et al. | 228/103 |
| 4,792,683 | 12/1988 | Chang et al. | 250/341 |

OTHER PUBLICATIONS

IBM Technical Disclosure Bulletin, vol. 22, No. 9, p. 4068, Feb. 1980.

IBM Technical Disclosure Bulletin, vol. 27, No. 5, p. 2967, Oct. 8, 1984.

Becker, "New Test Method Measures Solderability of Plated-Through Holes", Insulation Circuits, pp. 73–78, Dec. 1976.

Manko, Solders and Soldering, Sections 8-4, 8-5, 8-6, copyright 1979.

Metals Handbook Ninth Edition, vol. 6, pp. 1069, 1076, 1077, 1088–1091, 1101, copyright 1983.

Primary Examiner—Richard K. Seidel
Assistant Examiner—Samuel M. Heinrich
Attorney, Agent, or Firm—Timothy W. Markison; Joseph P. Krause; Steven G. Parmelee

[57] ABSTRACT

A bonding verification process which incorporates bonding test patterns and verifies the integrity of bonds by inspecting the bonding test patterns. For a bonding agent of solder, the bonding verification process verifies the integrity of solder connections by inspecting the bonding test patterns. The bonding test patterns can be implemented in a variety of configurations which verify several properties of the soldering process.

31 Claims, 2 Drawing Sheets

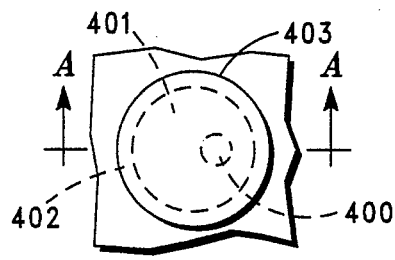
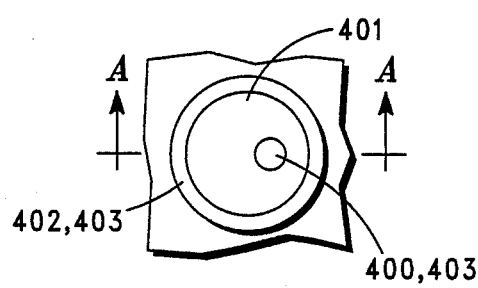
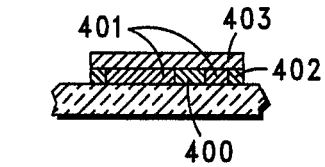
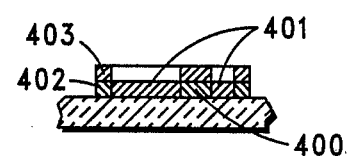
FIG.4A        FIG.4B
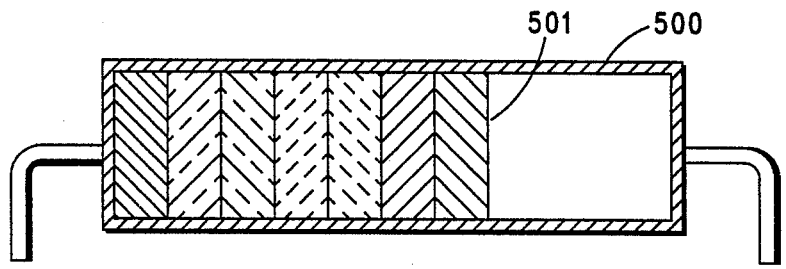
FIG.5A
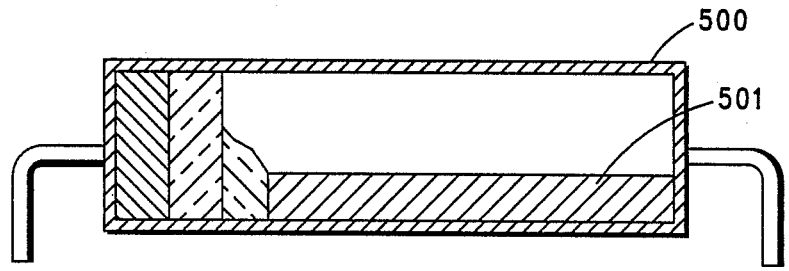
FIG.5B
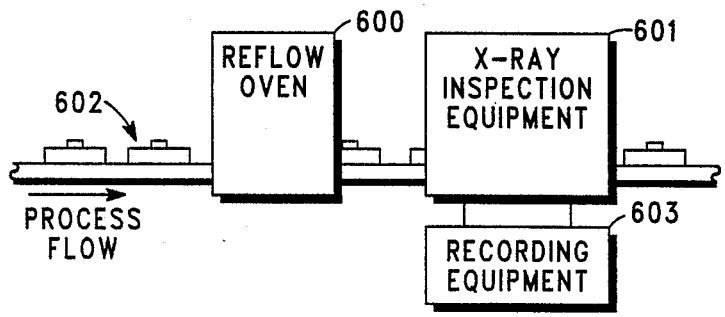
FIG.6

BONDING VERIFICATION PROCESS INCORPORATING TEST PATTERNS

TECHNICAL FIELD

Component-to-substrate bonding is verified by a variety of visual inspection techniques that inspect the component-to-substrate connection. The disclosed invention test the component-to-substrate connection by visually inspecting test patterns located on the substrate.

BACKGROUND OF THE ART

It is well known in the art that substrates experience temperature variations during an automated soldering process due to varying component masses. Specific oven profiles control the temperature variations in high mass areas by increasing the heating time and in low mass areas by decreasing the heating time. If the oven profile drifts, the component mass changes, or the emissivity of the substrate changes, the automated soldering process may yield unacceptable results. To avoid having to rework or scrap product, the soldering process is periodically verified by verification methods such as visual inspections or thermal profile runs.

The visual inspection method verifies the soldering process by periodically sampling the substrates and visually inspecting the solder connections. The visual inspection step is usually performed after soldering process is complete and checks for solder bridges, solder balls and misheated solder connections. This method has limited usefulness because it samples only a small percentage of substrates, requires an extra production step, and does not provide individual substrate test data.

The thermocouple profile run method periodically verifies the soldering process by measuring the oven profile temperatures. This method runs a test substrate instrumented with thermocouples through the automated soldering process. The test substrate records the oven profile temperatures and determines if the oven profile has drifted. This method has limited usefulness because it interrupts the soldering process, requires an extra production step, and does not provide individual substrate test data.

Another verification method employs automated x-ray equipment to inspect the soldering process by inspecting the solder connections. This method inspects the resulting solder connections and detects soldering defects such as porosity, solder bridges and solder balls. This method inspects each substrate without additional production steps; however, it only measures the amount and location of solder, not whether the solder has reflowed properly.

A need therefore exists for a solder verification method that will be an integral part of the soldering process, does not require additional production steps, inspects and produces test results for each substrate, and verifies proper solder reflow.

SUMMARY OF THE INVENTION

This need is substantially met by the bonding verification process incorporating test patterns disclosed herein. The disclosed process comprises the steps of: placing test patterns on a substrate; applying a bonding agent to the test patterns; applying the bonding agent to components and the substrate; altering the state of the bonding agent; and inspecting the altered state of the bonding agent applied to the test patterns. The disclosed verification process can be incorporated into an automated bonding process without addtional production steps and provides test data for each substrate.

In one embodiment, the substrate is a printed circuit board (PCB), the test patterns are PCB solder pads, and the bonding agent is solder. By positioning the test patterns proximate to component-to-PCB solder connections, the test patterns will accurately represent the solder connections. After heating, automated visual inspection equipment inspects the test patterns to verify that the solder has properly reflowed. The data is recorded for each substrate and provides a useful aid for determining early life failures.

In another embodiment, the bonding agent is solder and the test patterns are placeable components comprised of solders with different melting temperatures. The placeable components are positioned proximate to component-to-substrate solder connections, such that they will accurately represent the solder connections. After heating, the automated visual inspection equipment inspects the placeable components to determine which solders have melted. By knowning the melting temperatures of the various solders used in the placeable component, the solder connection temperature can be determined.

BRIEF DESCRIPTION OF THE DRAWINGS

FIG. 4A illustrates a top view and cross-sectional view of the pre-heating condition of a bonding test pattern with a bonding agent applied to a nonbonding surface, and FIG. 4B illustrates a top and cross sectional view of the post-heating condition of the bonding test pattern with the bonding agent applied to the nonbonding surface.

FIG. 5A illustrates the pre-heating condition of a placeable component comprised of various bonding agents, and FIG. 5B illustrates the post-heating condition of the placeable component.

FIG. 6 illustrates an automatic solder reflow system that comprises a reflow oven, automatic x-ray inspection equipment, and recording equipment.

BEST MODE FOR CARRYING OUT THE INVENTION

The bonding verification process incorporating test patterns is most appicable for testing solder connections created by an automated soldering process. For the automated soldering process, a printed circuit board (PCB) comprises the substrate, PCB test patterns comprises the bonding test patterns, solder or solder paste comprises the bonding agent which is altered by heating and automated x-ray equipment performs the inspection. No additional production steps are required because the PCB test patterns are formed during PCB fabrication and solder is applied to the PCB test patterns during the automated soldering process.

FIGS. 1–4 illustrate a few possible PCB test patterns and solder combinations. The PCB test patterns are positioned proximate to specific solder connections for accurate representation. After heating, the automated x-ray equipment inspects each PCB assembly and produces individual test data.

Figure 1A:
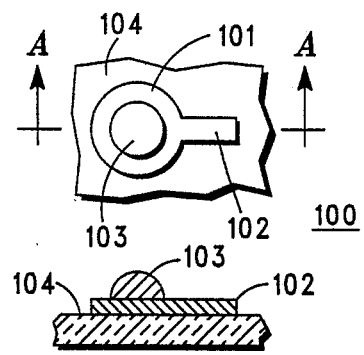
FIG. 1A illustrates a top and cross-sectional view of the pre-heating condition of a bonding test pattern with a tab.
Figure 1B:
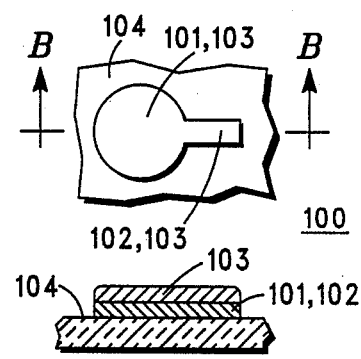
FIG. 1B illustrates a top and a cross-sectional view of the post-heating condition of the bonding test pattern with a tab.

In FIG. 1, the PCB test pattern (100) consists of a circular PCB pad (101) with a solder tab (102) deposited on a substrate (104). In the pre-heating condition, a solder pattern (103) is positioned in the center of the circular PCB pad (101) but not on the solder tab (102). In the post-heating condition, the solder (103) has reflowed throughout the circular PCB pad (101) and onto the solder tab (102). Automated x-ray equipment inspects the solder tab (102) and can easily determine if the solder (103) has reflowed properly.

Figure 2A:
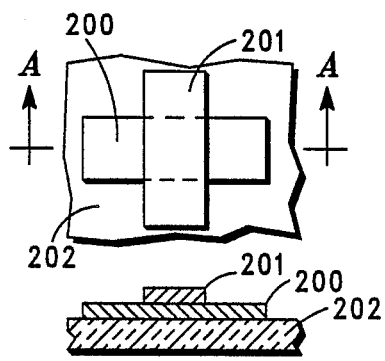
FIG. 2A illustrates a top and cross-sectional view of the pre-heating condition of a bonding test pattern with the bonding agent extending beyond the bonding test pattern area.
Figure 2B:
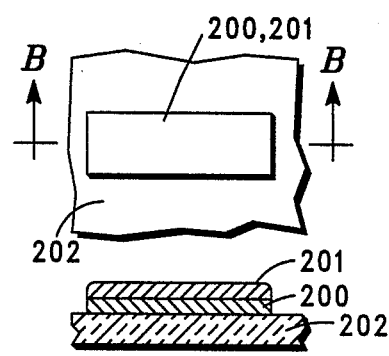
FIG. 2B illustrates a top and cross-sectional view of the post-heating condition of the bonding test pattern with the bonding agent extending beyond the bonding test pattern area.

FIG. 2 illustrates, in the pre-heating condition, a rectangular PCB test pattern (200), deposited on a substrate (202), with a rectangular solder pattern (201) positioned perpendicular to the PCB test pattern (200). After heating, as shown in the post-heating condition, the solder (201) has reflowed onto the entire PCB test pattern (200). The automated x-ray equipment inspects the PCB test pattern (200) to verify that the solder pattern (201) has reflowed properly.

Figure 3A:
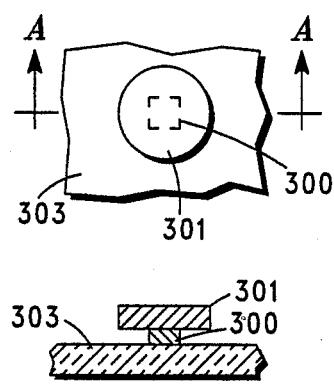
FIG. 3A illustrates a top and cross-sectional view of the pre-heating condition of a bonding test pattern with a bonding agent area larger than the bonding test pattern area.
Figure 3B:
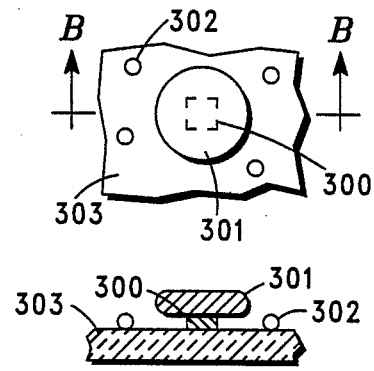
FIG. 3B illustrates a top and cross-sectional view of the post-heating condition of the bonding test pattern with the bonding agent area larger than the bonding test pattern area.

FIG. 3 illustrates a PCB test pattern (300) which verifies the solder reflow process and the solder's susceptibility to solder balling. In the pre-heating condition, a solder pattern (301) is positioned on the PCB test pattern (300) that is considerably larger than the PCB test pattern (300). After proper heating, the solder (301) beads up on the PCB test pattern (300). If the solder (301) is susceptible to solder balling, solder balls (302) will be formed on the substrate (303). The automated x-ray equipment inspects the PCB test pattern (300) and can easily detect both proper solder reflow and solder balling from this configuration.

FIG. 4 illustrates a solder verifying configuration which verifies the completeness of the solder reflow process. The configuration consists of a PCB test pad (400) and a solder pattern (403) positioned on the PCB test pad (400). The configuration further consists of a nonsolderable circular pad (401) encircled by a solderable ring (402). After heating, the automated x-ray equipment inspects the completeness of the solder reflow process by detecting the amount of solder (403) which has reflowed onto the solderable circular ring (402) and the PCB test pattern (400).

FIG. 5 illustrates a placeable solder verifying component (500) which verifies if the PCB assembly was overheated or underheated. The placeable solder verifying component (500) consists a plurality of solders (501) having different melting temperatures to form a temperature gradient. The placeable solder verifying component (500) can be automatically inserted, or placed, on the PCB and is inspected by the automated x-ray inspection equipment. The x-ray equipment tests which solders have melted such that the temperature of the applied heating is determined.

FIG. 6 illustrates a solder reflow system that comprises a reflow oven (600), automatic x-ray inspection equipment (601), and recording equipment (603). PCB assemblies (602) enter the reflow oven (600) wherein the solder (not shown) is melted to create solder bonds. The automatic x-ray inspection equipment (602) inspects the solder bonds and generates test data for each PCB assembly processed. The recording equipment (603) receives and stores the test data such that each PCB assembly (602) has a permanent record of the solder reflow process.

What is claimed is:

1. A method of bonding verification, which comprises the steps of:
   (a) positioning at least one bonding test pattern on a substrate;
   (b) applying a bonding agent to said at least one bonding test pattern;
   (c) applying the bonding agent to components and the substrate;
   (d) altering the applied bonding agent state to adhere the components to the substrate; and
   (e) inspecting the altered state of the bonding agent applied to said at least one bonding test pattern.

2. The bonding verification method of claim 1 wherein the method further comprises the step of recording the altered state of the bonding agent applied to said at least one bonding test pattern.

3. The bonding verification method of claim 1 wherein the inspection is done by automated x-ray equipment.

4. The bonding verification method of claim 1 wherein the bonding agent comprises solder and is altered by heating.

5. The bonding verification method of claim 1 wherein said at least one bonding test pattern is positioned proximate to the components to accurately represent the component-to-substrate bond.

6. The bonding verification method of claim 1 wherein the substrate comprises a printed circuit board.

7. The bonding verification method of claim 6 wherein said at least one bonding test pattern comprises a solder pad on the printed circuit board.

8. The bonding verification method of claim 7 wherein the bonding agent comprises solder and is altered by heating.

9. The bonding verification method of claim 6 wherein the bonding agent comprises solder and solder paste, and the solder and solder paste are altered by heating.

10. The bonding verification method of claim 9 wherein x-ray equipment inspects said at least one test pattern to facilitate the determination of the temperature of the heat applied.

11. The bonding verification method of claim 9 wherein x-ray equipment inspects said at least one test pattern to facilitate the determination of the solder's susceptability to solder ball.

12. The bonding verification method of claim 11 wherein the method further comprises the step of recording the x-ray inspection results for each bonding test pattern.

13. A method of determining bonding agent heating, which comprises the steps of:
   (a) positioning a plurality of test patterns on a substrate;
   (b) applying bonding agents with varying melting temperatures to said plurality of test patterns;

(c) applying a selected bonding agent to positioned components on the substrate and to the substrate;

(d) heating the substrate to melt said selected bonding agent to form a bond between the components and the substrate; and (e) inspecting the plurality of test patterns and the applied bonding agents to facilitate determination of the temperature applied in step (d).

14. The bonding agent heating determination method of claim 13 wherein the method further comprises the step of recording the temperature determined from step (e) for each said plurality of test patterns.

15. The bonding agent heating determination method of claim 13 wherein the inspection is done by automated x-ray equipment.

16. The bonding agent heating determination method of claim 13 wherein the bonding agents comprises solder with various melting temperatures such that a temperature gradient is developed wherein the applied heating is determined.

17. The bonding agent heating determination method of claim 13 wherein the substrate comprises a printed circuit board (PCB), the plurality of test patterns comprise PCB solder pads, and the bonding agents comprise solder.

18. The bonding agent heating detemination method of claim 17 wherein the method further comprises the step of recording the temperature determined from step (e) for each said plurality of test patterns.

19. The bonding agent heating determination method of claim 13 wherein the plurality of test patterns and the bonding agents with varying melting temperatures are combined into a placeable component.

20. The bonding agent heating determination method of claim 19 wherein the method further comprises the step of recording the temperature determined from step (e) for each placeable component.

21. The bonding agent heating determination method of claim 19 wherein the bonding agents with varying melting temperatures comprises solder with various melting temperatures.

22. The bonding agent heating detemination method of claim 21 wherein the method further comprises the step of recording the temperature determined from step (e) for each placeable component and the inspection is performed by automated x-ray equipment.

23. Bonding verification system, comprising:

bonding means applied to a substrate and components for adhering the components to the substrate;

bonding test means located on the substrate sufficiently close to the components for representing components-to-substrate bonding integrity;

heating means which acts upon the bonding means, the bonding test means, the components and the substrate for melting the bonding means such that the components are bonded to the substrate; and bonding inspection means for verifying the components-to-substrate bonding integrity by inspecting the bonding test means.

24. The bonding verification system of claim 23 further comprises recording means operably coupled to the bonding inspection means for recording the components-to-substrate bonding integrity.

25. The bonding verification system of claim 23 wherein the inspection means comprises automated x-ray equipment.

26. The bonding verification system of claim 23 wherein the bonding means comprises solder.

27. The bonding verification system of claim 23 wherein the bonding test main comprises a placeable component comprised of the bonding means with various melting temperatures.

28. The bonding verification system of claim 27 further comprises recording means operably coupled to the bonding inspection means for recording the components-to-substrate bonding integrity wherein the inspection means comprises visual inspection equipment which inspects the placeable component to determine temperature of applied heating.

29. The bonding verification system of claim 23 wherein the bonding test means comprises at least one test pattern with the bonding means applied to it.

30. The bonding verification system of claim 29 wherein the substrate comprises a printed circuit board, said at least one test pattern comprises a solder pad, and the bonding means comprises solder.

31. The bonding verification system of claim 29 further comprises recording means operably coupled to the bonding inspection means for recording the components-to-substrate bonding integrity wherein the inspection means comprises automated x-ray equipment, which inspects said at least one test pattern with the bonding means applied to it.

* * * * *

UNITED STATES PATENT AND TRADEMARK OFFICE
CERTIFICATE OF CORRECTION

PATENT NO. : 4,944,447

DATED : July 31, 1990

INVENTOR(S) : Thome, John R.

It is certified that error appears in the above-identified patent and that said Letters Patent is hereby corrected as shown below:

Column 6, line 23, please change the word "main" to --means--

Signed and Sealed this

Tenth Day of December, 1991

Attest:

HARRY F. MANBECK, JR.

*Attesting Officer*      *Commissioner of Patents and Trademarks*